(12) United States Patent
Elliott et al.

(10) Patent No.: US 7,446,584 B2
(45) Date of Patent: Nov. 4, 2008

(54) TIME DELAY APPARATUS AND METHOD OF USING SAME

(75) Inventors: Ken Elliott, Thousand Oaks, CA (US); Susan Morton, Newbury Park, CA (US); Mark Rodwell, Goleta, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1036 days.

(21) Appl. No.: 10/256,099

(22) Filed: Sep. 25, 2002

(65) Prior Publication Data

US 2004/0056698 A1    Mar. 25, 2004

(51) Int. Cl.
*H03H 11/26* (2006.01)
(52) U.S. Cl. ...................................... 327/280; 327/359
(58) Field of Classification Search ................ 327/250, 327/266, 280, 287, 359
See application file for complete search history.

(56) References Cited

U.S. PATENT DOCUMENTS

| | | | | |
|---|---|---|---|---|
| 4,797,586 A * | 1/1989 | Traa | ............................ | 327/276 |
| 5,144,174 A * | 9/1992 | Murakami | .................... | 327/277 |
| 5,945,863 A * | 8/1999 | Coy | ............................. | 327/280 |
| 6,092,030 A * | 7/2000 | Lepejian et al. | ............... | 702/79 |
| 6,133,773 A * | 10/2000 | Garlepp et al. | ............... | 327/247 |
| 2003/0179027 A1 * | 9/2003 | Kizer et al. | ................. | 327/158 |

FOREIGN PATENT DOCUMENTS

| | | | |
|---|---|---|---|
| EP | 0302262 A | 2/1989 |
| EP | 0317758 A | 5/1989 |
| EP | 0317759 A | 5/1989 |
| EP | 0964516 A | 12/1999 |

OTHER PUBLICATIONS

P.A. Dawson and S. P. Rogerson, "An Undersea Fiber-Optic Regenerator Using and Integral-Substrate Package and Flip-Chip SAW Mounting", J. Lightwave Technology, vol. LT-2, No. 6, Dec. 1984.

L. Schmidt and H. Rein, "Continuously Variable Gigahertz Phase-Shifter IC Covering more than One Freq. Decade", IEEE J. Solid-State Circuits, vol. 27, No. 6, Jun. 1992.

(Continued)

*Primary Examiner*—Quan Tra
(74) *Attorney, Agent, or Firm*—Tope-McKay & Associates

(57) ABSTRACT

Disclosed is a time delay generator 200 apparatus and method. The apparatus includes a time delay gate 212, a mixer 216 (a Gilbert cell circuit), and a current digital to analog converter 206. The mixer 216, comprised of first and second transistor differential pairs 218 and 220, receives an analog input signal 202 without a delay as well as a delayed input signal 210 produced by the time gate delay. The digital to analog converter regulates the relative current flow between a first control signal 232 and a second control signal 238, effectively altering the mixing of the undelayed input signal 208 and the delayed input signal 210 to generate a delayed output signal 214 with a time or phase delay substantially equal to the temporal delay represented by the digital signal input 204. The time delay generator exhibits reduced phase noise and a linear time delay response.

17 Claims, 3 Drawing Sheets

OTHER PUBLICATIONS

T. Otsuji and N. Narumi, "A 10-ps Resolution, Process-Insensitive Timing Generator IC", IEEE J. Solid-State Circuits, vol. 24, No. 5, Oct. 1989.

S. Nitta, et al., "A Variable Delay Generator for DESKEW IC using ECL Gate Array", Symp. On VLSI Circuits, 1991.

M. Chua and K. W. Martin, "1 GHz Programmable Analog Phase Shifter for Adaptive Antennas", IEEE 1998 Custom IC Conference, p. 71, 1998.

T. Otsuji and N. Narumi, "A 3-ns Range, 8-ps Resolution, Timing Generator LSI Utilizing Si Bipolar Gate Array," IEEE J. Solid-State Circuits, vol. 26, No. 5, May 1991.

A. Pentland, R. W. Picard, S. Sclaroff "Photobook: content-based manipulation of image databases" International Journal of Computer Vision 18, Jun. 3, 1996, Kluwer Academic Publishers, p. 233-254, 0920-5691.

Vasconcelos, Nuno, Lippman, Andrew, "Library-based coding: a representation for efficient video compression and retrieval," Data Compression Conference Proceedings, Mar. 25-27, 1997, Sponsored by: IEEE, pp. 121-130.

T. Keaton, R. Goodman, "A compression framework for content analysis," Proceedings IEEE Workshop on Content-Based Access of Image and Video Libraries (CBAIVL'99), IEEE Comput. Soc. 1999, pp. 69-73, Los Alamitos, CA, USA.

A. Vellaikal, C.-C. Jay Kuo, "Joint spatial-spectral indexing for image retrieval," IEEE International Conference on Image Processing, v. 3, Sep. 16-19, 1996, Sponsored by: IEEE, pp. 867-870.

B. Walls, A. Maalanobis, "Performance of the MACH Filter and DCCF algorithms in the presence of data compression," Raytheon Missle Systems Company.

C. Liu and H. Wechsler, "Robust Coding Schemes for Indexing and Retrieval from Large Face Database," IEEE Transactions on Image Processing, vol 9, No. 1, Jan. 2000, pp. 132-137.

J. W. Nahm and M. J.T. Smith, "Optimized Encoder Design Algorithm for Joint Compression and Recognition," SPIE, vol. 2484, pp. 236-245.

* cited by examiner

TIME DELAY APPARATUS AND METHOD OF USING SAME

STATEMENT OF GOVERNMENT RIGHTS

Elements of this invention were made with U.S. Government support from the Defense Advanced Research Projects Agency, under Government Contract Number N00014-99-C-0159. The U.S. Government may have certain rights in this invention.

TECHNICAL FIELD

The present invention relates to a true time delay generator. More specifically, the present invention relates to an apparatus and method for generating a true time delay using a Gilbert cell circuit with digital to analog converter control.

BACKGROUND

There are a number of time delay generators known in the prior art, including those employing Gilbert cell circuit configurations. In each of the previous time delay generators, the mixing of delayed and undelayed input signals is regulated by an analog control signal coupled to the differential transistor pairs of the mixing circuit. The application of a single analog control signal causes two significant problems substantially overcome by the present invention. First, the time delay response in the prior art Gilbert cell time delay generators is non-linear, often requiring a pre-distortion stage to compensate and correct the analog control signal. With the time delay of the output signal charted on the vertical axis of FIG. 1, the time delay response 100 of the prior art time delay generator varies non-linearly across the entire analog control signal voltage range charted on the horizontal axis. Second, external noise on the analog control signal introduces phase noise in prior art time delay generators. The degradation in phase resolution is significant and is commonly the limiting factor in the performance of high frequency time delay generators operating in and above the microwave band.

Therefore, it would be desirable to have means, first, to control the mixing of delayed and undelayed input signals in a manner that is linearly responsive to one or more control signals and, second, to prevent control signal noise from propagating into the mixer where it causes phase noise and phase resolution degradation.

SUMMARY OF THE INVENTION

One aspect of the present invention provides an apparatus for generating a variable time delay to produce a delayed output signal having a time delay governed by a digital signal input. The apparatus is comprised of delaying means for generating a delayed input signal by retarding the undelayed input signal by a predetermined time period representing the maximum system time or phase delay; a digital to analog converter for controlling current through first and second control lines in relation to a digital signal input; and mixing means for generating a delayed output signal by mixing the delayed input signal and undelayed input signal in proportion to the current through the first and second control lines.

Another aspect of the present invention provides a method for generating a variable time delay to produce a delayed output signal with a time delay governed by a digital signal input. The method is comprised of the steps of inputting an undelayed input signal; generating a delayed input signal by delaying the undelayed input signal by a predetermined time delay; inputting a digital word representing the time or phase delay to be applied to the undelayed input signal; and mixing the undelayed input signal and delayed input signal to produce a delayed output signal having a time or phase delay substantially related to the digital word.

Another aspect of the time delay generator is operable at radio frequencies, gigahertz frequencies, above gigahertz frequencies. Further, the time delay generator possesses phase resolution of less than one picosecond, and the signal delaying means provides a delay that is on the order of less than 100 picoseconds.

BRIEF DESCRIPTION OF THE DRAWINGS

The accompanying drawings form a part of the specification, and illustrate various aspects of the invention. The drawings, taken together with the description, serve to explain the principles of the invention, wherein.

DETAILED DESCRIPTION

The present invention provides a method and an apparatus for generating a delayed output signal, with respect to an input signal, having a variable time delay governed by a digital signal input. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of aspects. Thus, the present invention is not intended to be limited to the aspect presented, but is to be accorded the widest scope with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

Figure 2:
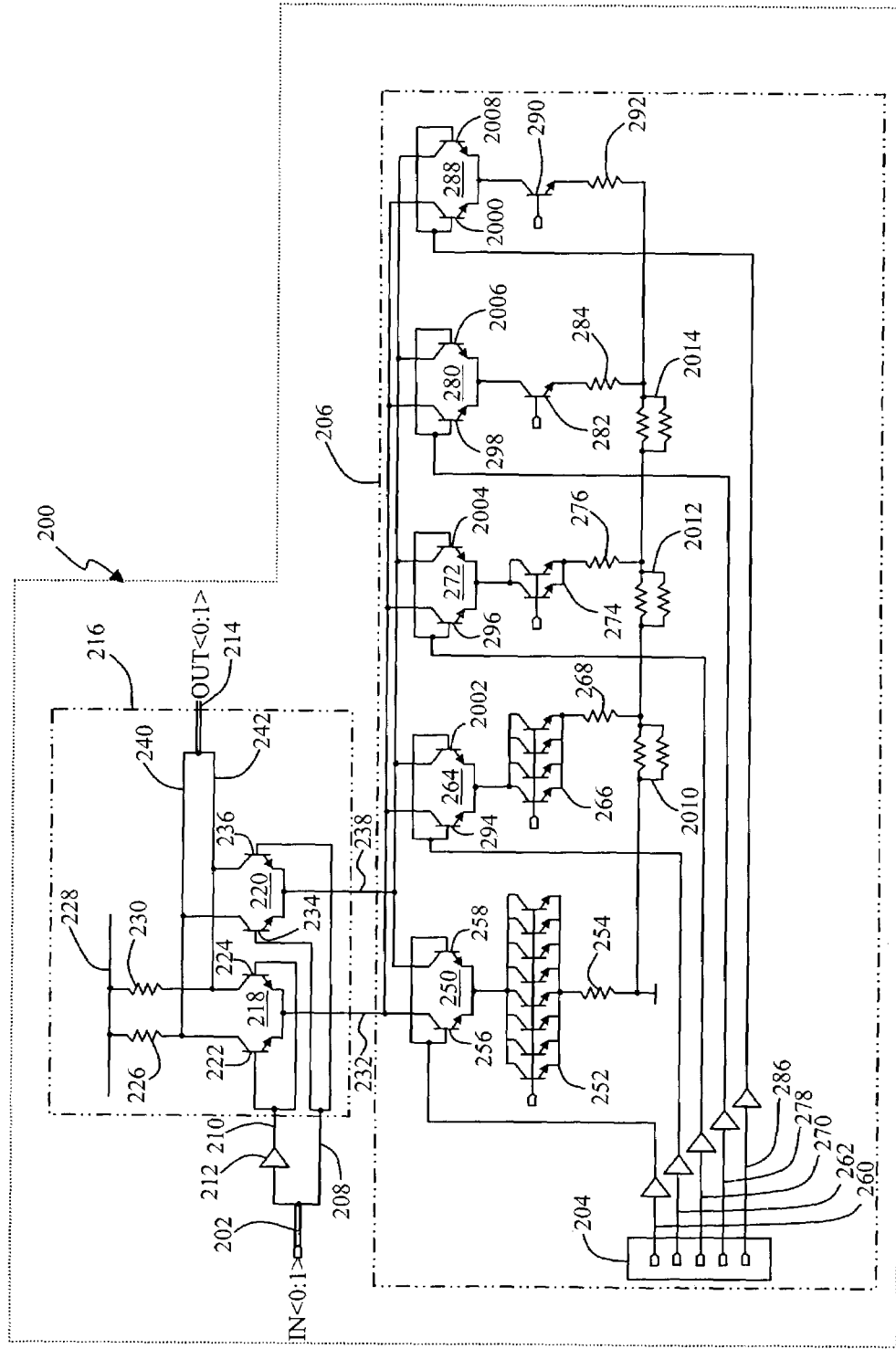
FIG. 2 is a circuit diagram illustrating the time delay generator of the present invention for generating a delayed output signal by inducing a programmable delay in an input signal.

Referring to FIG. 2, a block diagram illustrating the time delay generator 200 of the present invention is shown. The time delay generator 200 delays an analog input signal 202 which is in the form of two inputs in the format "IN<0:1>, to generate a delayed output signal 214, which is in the form of two inputs in the format of OUT<0:1>. Where the delay is determined by the value of a digital word provided at the digital signal input 204 of the digital to analog converter, DAC 206. The analog input signal 202 is bifurcated to form an undelayed input signal 208 and a delayed input signal 210 by means of signal delaying means 212. The signal delaying means 212 may take the form of a time delay gate or comparable means for inducing a predetermined time, or phase, delay in the input signal 202. The signal delaying means maybe a tapped delay line. The time or phase delay of the signal delaying means 212 represents the maximum delay by which the output signal 214 of the time delay generator 200 may lag behind the input signal 202.

The delayed input signal 210 is conveyed to a mixer 216 comprised of a first differential pair 218 and a second differential pair 220. The first differential pair 218 is comprised of a first transistor 222 and a second transistor 224. The base of the first transistor 222 is coupled to the delayed input signal 210 and the collector coupled to a first resistor 226 which is, in turn, coupled to a supply voltage 228. The base of the second transistor 224 is coupled to the delayed input signal 210 and the collector coupled to a second resistor 230 which is, in turn, coupled to the supply voltage 228. In the preferred aspect, the first resistor 226 and second resistor 230 have equal resistances, but this is not required for operation. The emitters of the first transistor 222 and the second transistor 224 are coupled to one another as well as the first control signal 232 discussed below.

The undelayed input signal 208 is conveyed to a second differential pair 220 comprised of a first transistor 234 and a second transistor 236. The base of the first transistor 234 is coupled to the undelayed input signal 208 and the collector coupled to the collector of the first transistor 222 of the first differential pair 218. The base of the second transistor 236 is coupled to the undelayed input signal 208 and its collector coupled to the second transistor 224 of the first differential pair 218. The emitters of the first transistor 234 and the second transistor 236 are coupled to one another as well as a second control signal 238 discussed below.

A slow output signal 240 is coupled to the collector of the first transistor of the first 218 and second 220 differential pairs. A fast output signal 242 is coupled to the collector of the second transistor of the first differential pair 218 and the second differential pair 220. The slow output signal 240 and the fast output signal 242 are coupled in the mixing means 216 to form the delayed output signal 214. The delayed output signal 214 substantially replicates the input signal 202 with a time or phase delay related to the relative current flow through the first differential pair 218 and second differential pair 220, the current flow being governed by the first control signal 232 and the second control signal 238 from the digital to analog converter 206.

Consider, for example, the special case in which the current through the first differential pair 218 is zero and the second differential pair 220 is maximal. The only signal contribution observed is from the fast output signal 242. Thus, the output signal 214 is equivalent to the output signal 202 without any time or phase delay. In the case where the maximal current flow through the mixer 216 passes via the first differential pair 218, the output signal 214 is comprised entirely of the slow output signal 240. In such a case, the output signal 214 substantially replicates the delayed input signal 210 and its maximal time delay.

In one preferred aspect, the current DAC 206 includes a five-bit input 204 and dual control line output comprised of a first control signal 232 and second control signal 238. One skilled in the art will, however, recognize the advantages of implementing a DAC with a greater or lesser number of input bits. Each of the five digital inputs is operatively coupled to a sub-circuit including, in series, a differential pair of transistors, a plurality of transistors, and a plurality of resistors connected to ground.

The first sub-circuit, representative of each of the five sub-circuits of the DAC 206, is comprised of a differential pair 250, transistor bank 252, and resistor 254. The differential pair 250 is comprised of first 256 and second 258 transistors, the base of each operatively coupled to the least significant bit, LSB 260. Similarly, the second sub-circuit is responsive to a second digital input 262 and is comprised of second differential pair 264, second transistor bank 266, and resistor 268. The third sub-circuit is responsive to a third digital input 270 and is comprised of third differential pair 272, third transistor bank 274, and resistor 276. The fourth subcircuit is responsive to a fourth digital input 278 and is comprised of fourth differential pair 280, fourth transistor bank 282, and resistor 284. Completing the DAC 206, the fifth sub-circuit is responsive to a fifth digital input 286 and is comprised of fifth differential pair 288, fifth transistor bank 290, and resistor 292.

The first control signal 232 is coupled to the collector of the first transistor of each sub-circuit differential pair, specifically first transistors 256, 294, 296, 298, and 2000. Similarly, the second control signal 238 is coupled to the collector of the second transistor of each sub-circuit differential pair, specifically second transistors 258, 2002, 2004, 2006, and 2008.

Each of the five bits of the digital signal input 204 regulates the flow of current through its corresponding differential pair and sub-circuit resistor. The flow of current through each sub-circuit, in conjunction with the current flow through a first parallel resistor combination 2010, second parallel resistor combination 2012, and third resistor combination 2014, causes the voltage on control signals 232 and 238 to linearly scale, in a step-wise fashion, in proportion to the digital word input at the digital signal input 204. As the voltage on the first control signal 232 and second control signal 238 is varied, the current ratio between the two control lines also varies. Furthermore, the variation in the current ratio between the control lines affects a change in the relative current flow through the first differential pair 218 and the second differential pair 220, resulting in a delayed output signal 214 having a time or phase delay that is linearly proportion to the digital word asserted at digital signal input 204.

The present invention provides a time delay generator having a linear response, and consequently the present invention may be operated without the need of a pre-distortion stage to linearize the output of the time delay generator. The present invention has the further advantage of isolating the mixing means 216 from control line noise that would otherwise propagate into the mixing means and degrade the time or phase delay resolution. Unlike prior art systems, the inclusion of the DAC 206 prevents analog control signal noise from translating linearly into a current noise and subsequent phase noise in the mixing means 216, thus permitting the invention to achieve picosecond delay resolution at gigahertz frequencies.

Figure 3:
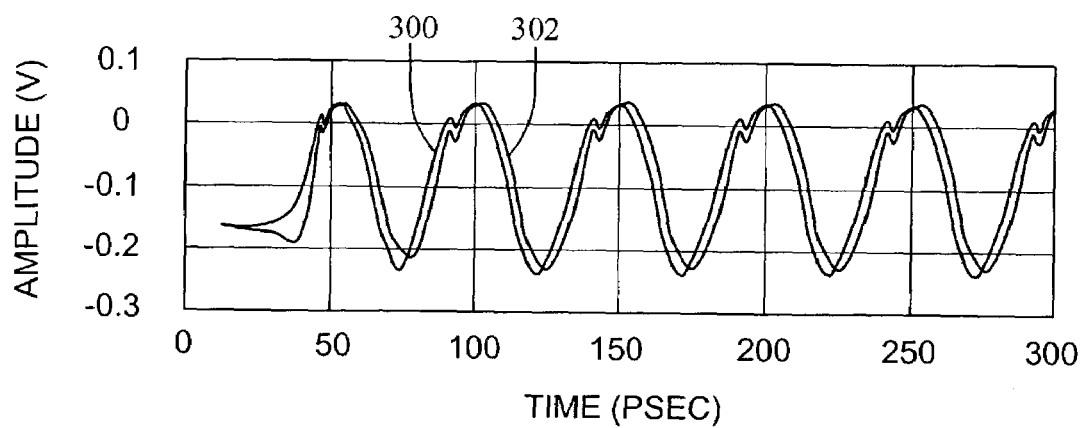
FIG. 3 is a plot depicting a 10 GHz input signal and the corresponding time delay generator output signal having a delay of about five picoseconds.

Illustrated in FIG. 3 is a 20 GHz input signal 300 and the corresponding delayed output signal 302 having a delay of about five picoseconds. As evidenced by the test results of FIG. 3, the time delay generator 200 of the present invention reproduces the sinusoidal input signal with a controllable delay having a high degree of accuracy and reduced phase noise.

Figure 1:
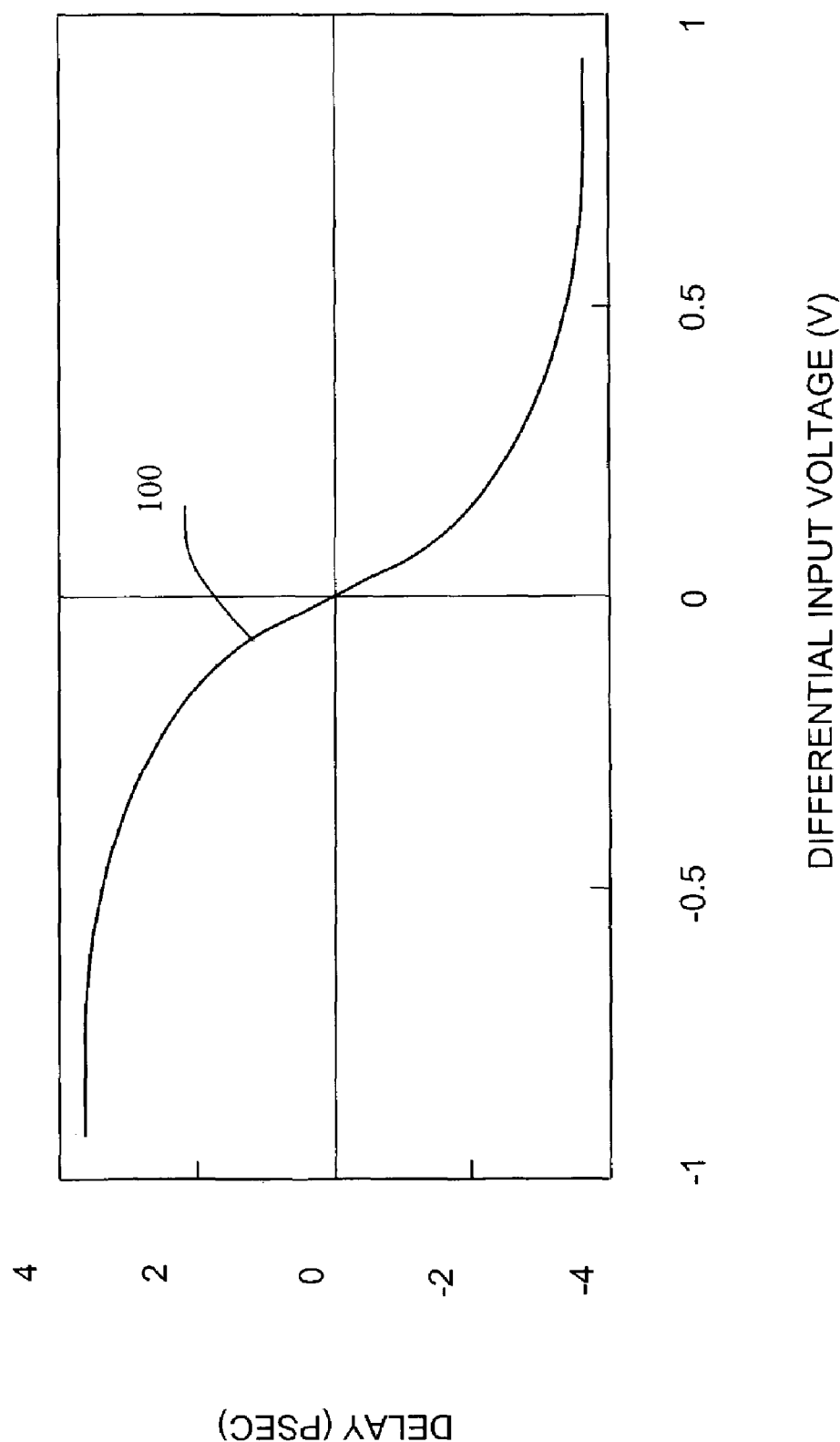
FIG. 1 is a plot showing the non-linear time delay response of the prior art time delay generators having a Gilbert cell with analog control.
Figure 4:
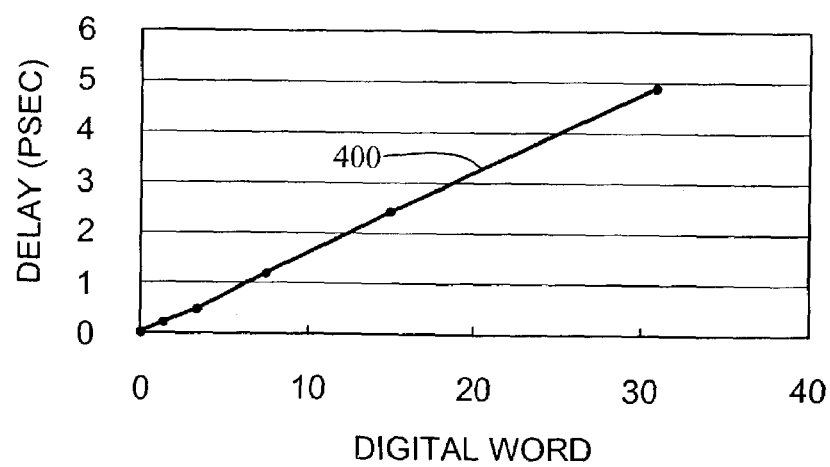
FIG. 4 is a plot illustrating the linear time delay generator response of the present invention as a function of the value of the digital signal input.

Referring now to FIG. 4, the linearity of the time delay generator 200 as a function of the value of the digital signal input 204 is illustrated (also referring to FIG. 2). The time delay response 400, the delay by which the delayed output signal 214 lags behind the undelayed input signal 202, is charted on the vertical axis against the value of the digital word applied to the digital signal input 204. The delay is plotted for six values of the digital word including, in binary representation, 00000, 00001, 00010, 00100, 01000, and 11111 (decimal 0, 1, 2, 4, 8, and 31, respectively). In accordance with the present invention, the time delay response 400 of the time delay generator 200 is substantially linear with respected to the value of the input control applied to digital signal input 204, in contrast to the analog input control of the prior art system illustrated in FIG. 1.

What is claimed is:

1. A time delay generator comprising:
   signal delaying means for outputting a delayed input signal by delaying an input signal a predetermined time period;
   a digital to analog converter, responsive to a digital signal input, for controlling current through a plurality of control signals; and
   mixing means, responsive to the plurality of control signals, for generating a delayed output signal by mixing the delayed input signal and the input signal in proportion to the current through the plurality of control signals, respectively,
   wherein a delay between the input signal and the delayed output signal is substantially linear with the digital signal input.

2. A time delay generator as set forth in claim 1, wherein the plurality of control signals is comprised of a first control signal and a second control signal.

3. A time delay generator as set forth in claim 2, wherein the mixing means comprises:
   (i) a first differential pair comprised of a first transistor and second transistor where a base of each the first and second transistors is operatively coupled to the delayed input signal and the emitter of each of the first and second transistors is operatively coupled to the first control signal;
   (ii) a second differential pair comprised of a first transistor and second transistor where a base of each the first and second transistors is operatively coupled to the input signal and an emitter of each of the first and second transistors is operatively coupled to the second control signal.

4. A time delay generator as set forth in claim 3, wherein a collector of the first transistor of the first differential pair and a collector of the first transistor of the second differential pair are operatively coupled to a supply voltage by means of a first resistor.

5. A time delay generator as set forth in claim 4, wherein a collector of the second transistor of the first differential pair and a collector of the second transistor of the second differential pair are operatively coupled to the supply voltage by means of a second resistor.

6. A time delay generator as set forth in claim 5, wherein resistances of the first and second resistors are of substantially the same value.

7. A time delay generator as set forth in claim 6, wherein the delayed output signal is formed from the union of a fast output signal and a slow output signal.

8. A time delay generator as set forth in claim 7, wherein:
   (a) the fast output signal is electrically coupled to the collector of the second transistor of the first and second differential pairs; and
   (b) the slow output signal is electrically coupled to the collector of the first transistor of the first and second differential pairs.

9. A time delay generator as set forth in claim 8, wherein the digital to analog converter includes the digital signal input consisting of one of the following: two bits, three bit, four bits, five bits, six bits, seven bits, eight bits, nine bits, ten bits, eleven bits, twelve bits, thirteen bits, fourteen bits, fifteen bits, and sixteen bits.

10. The time delay generator in claim 8, wherein the time delay generator is operable at radio frequencies.

11. The time delay generator in claim 8, wherein the time delay generator is operable at gigahertz frequencies.

12. The time delay generator in claim 8, wherein the time delay generator is operable at and above gigahertz frequencies.

13. The time delay generator in claim 8, wherein the time delay generator possesses phase resolution of less than one picosecond.

14. The time delay generator in claim 8, wherein the predetermined time period of delay of the signal delaying means is less than 100 picoseconds.

15. The time delay generator in claim 8, wherein the signal delaying means is a tapped delay line.

16. A method for generating a delayed output signal in a time delay generator, the method comprising the steps of:
   inputting an undelayed input signal;
   generating a delayed input signal by delaying the undelayed input signal by a predetermined time representing a maximal time delay;
   inputting a digital word at a digital signal input wherein the digital word represents a variable time delay; and
   mixing, in response to the digital word, the undelayed input signal and delayed input signal to produce the delayed output signal having an effective time delay, relative to the undelayed input signal, that is substantially equal to the variable time delay represented by the digital word, wherein the effective time delay is substantially linear with the digital signal input.

17. A method for generating a delayed output signal in a time delay generator as set forth in claim 16, wherein the mixing step further includes the step of using the digital word at the digital signal input to regulate the relative current flow through a first control signal and second control signal.

* * * * *